United States Patent
Tao et al.

(10) Patent No.: US 9,543,269 B2
(45) Date of Patent: Jan. 10, 2017

(54) SYSTEM-LEVEL PACKAGING METHODS AND STRUCTURES

(75) Inventors: Yujuan Tao, Nantong (CN); Lei Shi, Nantong (CN); Honghui Wang, Nantong (CN)

(73) Assignee: NANTONG FUJITSU MICROELECTRONICS CO., LTD., Nantong (CN)

( * ) Notice: Subject to any disclaimer, the term of this patent is extended or adjusted under 35 U.S.C. 154(b) by 0 days.

(21) Appl. No.: 13/984,929

(22) PCT Filed: Mar. 22, 2012

(86) PCT No.: PCT/CN2012/072769
§ 371 (c)(1),
(2), (4) Date: Aug. 12, 2013

(87) PCT Pub. No.: WO2012/126377
PCT Pub. Date: Sep. 27, 2012

(65) Prior Publication Data
US 2013/0320534 A1    Dec. 5, 2013

(30) Foreign Application Priority Data

Mar. 22, 2011 (CN) .......................... 2011 1 0069666
Mar. 22, 2011 (CN) .......................... 2011 1 0069869
(Continued)

(51) Int. Cl.
*H01L 23/00* (2006.01)
*H01L 23/538* (2006.01)
(Continued)

(52) U.S. Cl.
CPC .......... *H01L 24/95* (2013.01); *H01L 23/5389* (2013.01); *H01L 24/24* (2013.01); *H01L 24/25* (2013.01);
(Continued)

(58) Field of Classification Search
CPC .......... H01L 24/95; H01L 25/50; H01L 24/82; H01L 24/25; H01L 24/24; H01L 23/5389; H01L 25/0657
See application file for complete search history.

(56) References Cited

U.S. PATENT DOCUMENTS 6,005,778 A * 12/1999 Spielberger ............. H01L 24/49
257/686
6,498,054 B1 * 12/2002 Chiu et al. .................... 438/108
(Continued)

FOREIGN PATENT DOCUMENTS

| CN | 1449232 A | 10/2003 |
|---|---|---|
| CN | 1521816 A | 8/2004 |
| CN | 2664198 Y | 12/2004 |
| CN | 101188232 A | 5/2008 |
| CN | 101197360 A | 6/2008 |
| CN | 101330068 A | 12/2008 |
| CN | 101834150 A | 9/2010 |
| CN | 102176444 A | 9/2011 |
| CN | 202025746 U | 11/2011 |

*Primary Examiner* — Matthew Reames
*Assistant Examiner* — Vincent Wall
(74) *Attorney, Agent, or Firm* — Anova Law Group, PLLC

(57) ABSTRACT

A system-level packaging method includes providing a packaging substrate having a first functional surface and a second surface with wiring arrangement within the packaging substrate and between the first functional surface and the second surface. The method also includes forming at least two package layers on the first functional surface of the packaging substrate, wherein each package layer is formed by subsequently forming a mounting layer, a sealant layer, and a wiring layer. Further, the method includes forming a top sealant layer and planting connection balls on the second functional surface of the packaging substrate.

12 Claims, 9 Drawing Sheets

| (30) | Foreign Application Priority Data |
|---|---|
| Mar. 22, 2011 (CN) | 2011 1 0069991 |
| Mar. 22, 2011 (CN) | 2011 1 0069992 |
| Mar. 23, 2011 (CN) | 2011 1 0070917 |
| Mar. 23, 2011 (CN) | 2011 1 0070940 |

(51) Int. Cl.
- H01L 25/065 (2006.01)
- H01L 25/00 (2006.01)
- H01L 23/498 (2006.01)
- H01L 25/16 (2006.01)

(52) U.S. Cl.
CPC ........... H01L 24/82 (2013.01); H01L 25/0657 (2013.01); H01L 25/50 (2013.01); *H01L 23/49816* (2013.01); *H01L 24/96* (2013.01); *H01L 25/16* (2013.01); *H01L 2224/0401* (2013.01); *H01L 2224/04105* (2013.01); *H01L 2224/131* (2013.01); *H01L 2224/16148* (2013.01); *H01L 2224/24011* (2013.01); *H01L 2224/24146* (2013.01); *H01L 2224/24195* (2013.01); *H01L 2224/24226* (2013.01); *H01L 2224/25171* (2013.01); *H01L 2224/32225* (2013.01); *H01L 2224/48149* (2013.01); *H01L 2224/73204* (2013.01); *H01L 2224/73265* (2013.01); *H01L 2224/73267* (2013.01); *H01L 2224/8203* (2013.01); *H01L 2224/82101* (2013.01); *H01L 2224/96* (2013.01); *H01L 2225/06506* (2013.01); *H01L 2225/06513* (2013.01); *H01L 2225/06524* (2013.01); *H01L 2924/15311* (2013.01)

(56) References Cited

U.S. PATENT DOCUMENTS

| 6,838,761 B2* | 1/2005 | Karnezos | H01L 23/3128 257/659 |
|---|---|---|---|
| 6,861,288 B2* | 3/2005 | Shim | H01L 25/0657 257/686 |
| 7,242,081 B1* | 7/2007 | Lee | H01L 25/0657 257/686 |
| 7,564,137 B2* | 7/2009 | Lam | H01L 21/6835 257/686 |
| 7,589,410 B2* | 9/2009 | Kim | 257/686 |
| 7,763,498 B2* | 7/2010 | Kim | 438/113 |
| 8,685,792 B2* | 4/2014 | Chow | H01L 25/03 257/678 |
| 2003/0141583 A1* | 7/2003 | Yang | H01L 21/563 257/686 |
| 2004/0222508 A1* | 11/2004 | Aoyagi | H01L 21/561 257/686 |
| 2004/0222519 A1* | 11/2004 | Aoyagi | H01L 24/97 257/734 |
| 2007/0254406 A1* | 11/2007 | Lee | H01L 25/0657 438/109 |
| 2007/0262436 A1* | 11/2007 | Kweon | H01L 21/561 257/686 |
| 2008/0136002 A1* | 6/2008 | Yang | 257/686 |
| 2009/0294899 A1 | 12/2009 | Pagaila et al. | |
| 2009/0317944 A1* | 12/2009 | Kim | 438/107 |
| 2010/0140779 A1 | 6/2010 | Lin et al. | |

\* cited by examiner

SYSTEM-LEVEL PACKAGING METHODS AND STRUCTURES

CROSS-REFERENCES

This application claims the priority of Chinese patent application no. 201110069869.8, filed on Mar. 22, 2011, Chinese patent application no. 201110069666.9, filed on Mar. 22, 2011, Chinese patent application no. 201110069992.X, filed on Mar. 22, 2011, Chinese patent application no. 201110069991.5, filed on Mar. 22, 2011, Chinese patent application no. 201110070917.5, filed on Mar. 23, 2011, and Chinese patent application no. 201110070940.4, filed on Mar. 23, 2011, the entire contents of all of which are incorporated herein by reference.

FIELD OF THE INVENTION

The present invention generally relates to semiconductor technologies and, more particularly, to the methods and structures for system-level semiconductor packaging.

BACKGROUND

With the continuous development of integrated circuit (IC) technologies, the development trend for electronic products is moving towards more miniaturized and intelligent structures with high performance and high reliability. IC packaging not only has a direct impact on the performance of the integrated circuits, electronic modules, and even the systems, but also restricts the miniaturization, low-cost, and reliability of electronic systems. As the IC chip size keeps decreasing and the integration degree keeps increasing, higher and higher requirements for IC packaging technology are raised by the electronics industry.

Chinese patent publication number CN1747156C discloses a packaging substrate. The disclosed packaging substrate includes: a substrate having a surface; a ball pad located on the substrate surface; a solder mask layer formed on the surface of the substrate, with at least one opening to expose the ball pad; and a patterned metal reinforcing layer formed on the ball pad along the sidewall of the solder mask layer opening. However, when such packaging substrate is used, the system-level packaging integration degree may be still undesired.

On the other hand, with the trend for light, thin, short, and small products as well as increasingly high demand for system-level functionalities, the integration degree of system-level packaging needs to be further improved. The disclosed methods and systems are directed to solve one or more problems set forth above and other problems.

BRIEF SUMMARY OF THE DISCLOSURE

One aspect of the present disclosure includes a system-level packaging method. The method includes providing a packaging substrate having a first functional surface and a second surface with wiring arrangement within the packaging substrate and between the first functional surface and the second surface. The method also includes forming at least two package layers on the first functional surface of the packaging substrate, wherein each package layer is formed by subsequently forming a mounting layer, a sealant layer, and a wiring layer. Further, the method includes forming a top sealant layer and planting connection balls on the second functional surface of the packaging substrate.

Another aspect of the present disclosure includes a system-level packaging structure. The system-level packaging structure includes a packaging substrate having a first functional surface and a second surface with wiring arrangement within the packaging substrate and between the first functional surface and the second surface. The system-level packaging structure also includes at least two package layers formed on the first functional surface of the packaging substrate, wherein each package layer includes a mounting layer, a sealant layer, and a wiring layer formed subsequently. Further, the system-level packaging structure includes a top sealant layer and connection balls planted on the second functional surface of the packaging substrate.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
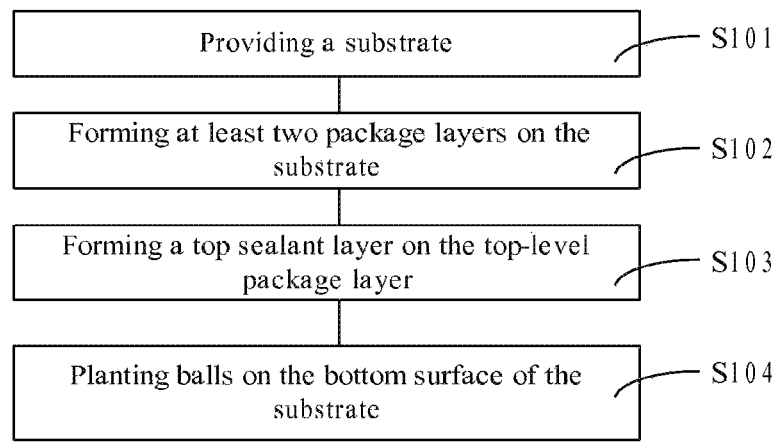
FIG. 1 illustrates an exemplary system-level packaging process consistent with the disclosed embodiments.
Figure 2:
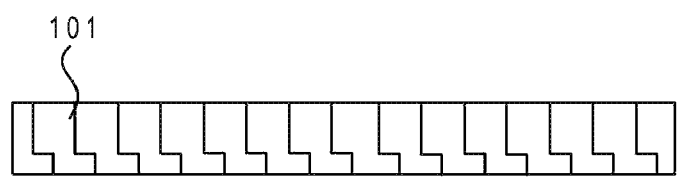
FIGS. 2-10 illustrate exemplary packaging structures corresponding to various steps in the system-level packaging process consistent with the disclosed embodiments.

FIG. 1 illustrates an exemplary system-level packaging process consistent with the disclosed embodiments. As shown in FIG. 1, at the beginning of the process, a packaging substrate is provided (S101). FIG. 2 is an exemplary structure corresponding to S101.

As shown in FIG. 2, a substrate 101 is provided. The substrate 101 may include any appropriate material used for IC packaging. For example, substrate 101 may include a BT (Bismaleimide Triazine) substrate or a PCB (Printed Circuit Board) substrate. Other types of substrates may also be used. Substrate 101 may be configured as the base for subsequently stacking package layers and may also be configured as the base for carrying any other subsequent layers of the system-level packaging structure.

Further, substrate 101 may include two functional surfaces, a first surface and a second surface. The first surface of the substrate 101 may be used for stacking the package layers; and the second surface may be used for planting balls (i.e., connection balls). In certain embodiments, the first surface is an upper surface of the substrate 101 and the second surface is a bottom surface of the substrate 101. Further, the upper surface and bottom surface may have pads for electrical connection. Wiring or interconnect may be arranged between the upper surface and bottom surface and within the substrate 101.

Returning to FIG. 1, after the substrate 101 is provided (S101), at least two package layers are formed on the substrate 101 (S102). As used herein, a package layer may refer to a single functional layer of IC components to be integrated into a system-level packaging structure. The package layer may include one or more layers of structures.

Figure 11:
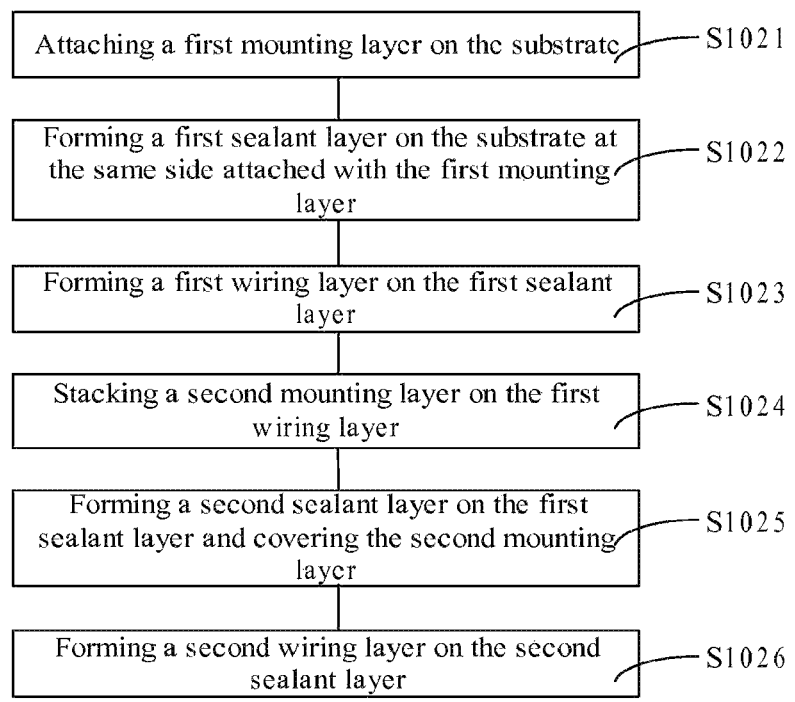
FIG. 11 illustrates exemplary process steps for forming two package layers consistent with the disclosed embodiments.

The package layers may be formed by various steps or processes. For example, FIG. 11 illustrates exemplary process steps for forming two package layers. Any number of package layers may be included.

Figure 3:
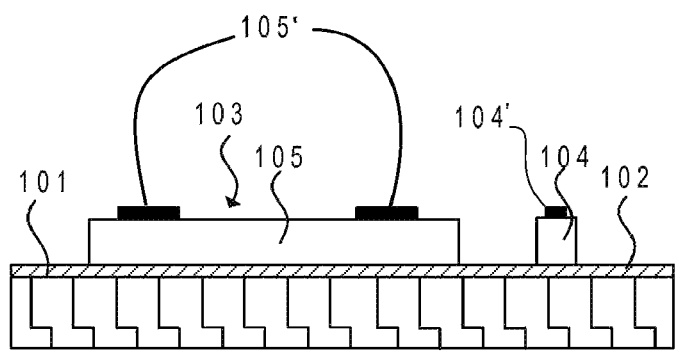

As shown in FIG. 11, a first mounting layer is attached on the provided substrate 101 (S1021). FIG. 3 shows a corresponding structure. As shown in FIG. 3, first mounting layer 103 is attached to the substrate 101 by a glue layer 102. That is, glue layer 102 may be first formed on top of the substrate 101 and may be used to attach or affix the first mounting layer 103 to the substrate 101. The glue layer 102 may be formed by any appropriate means, such as dispensing or printing. In certain embodiments, glue layer 102 may be omitted and other appropriate attaching means may be used instead.

The first mounting layer 103 may include a variety of semiconductor devices. In certain embodiments, the first mounting layer 103 may include a first chip group 105 and a first passive device group 104. The glue layer 102 may be formed or coated on locations on the substrate 101 corresponding to the first chip group 105 and the first passive device group 104.

The first chip group 105 may include a single chip or multiple chips. When multiple chips are included, the multiple chips may be of a same type or different types. Each chip may be a part of a system-level packaging structure to achieve one or more separate functions from various system-level functions to be provided by the system-level packaging structure, such as a system-on-chip.

The first passive device group 104 may include external circuit devices associated with the first chip group 105 to form proper circuitry for achieving the functions of the system-level packaging structure. The first passive device group 104 may include any appropriate passive devices, such as one or more of capacitors, resistors, and/or inductors. The devices in the first passive device group 104 may be selected based on particular applications or designs. By combining the first passive device group 104 and the first chip group 105 and packaging them together, different system-level functions can be achieved.

Further, when the first mounting layer 103 is attached onto the glue layer 102, the functional surface of the first mounting layer 103 is facing up, i.e., the functional surface is not in contact with the glue layer 102. For example, when the first mounting layer 103 includes the first chip group 105 and the first passive device group 104, the functional surface of the first chip group 105 is the surface having chip solder pad(s) or bonding pad(s), and the functional surface of the first passive device group 104 is the surface having solder pad(s) or bonding pad(s). Thus, when the first chip group 105 is attached, the surface having bonding pad(s) is kept facing up (on top side); when the first passive device group 104 is attached, the surface having bonding pad(s) is kept facing up (on top side).

In the first mounting layer 103, arrangement of the first chip group 105 and the first passive device group 104 may be designed according to the system functions. For example, a first chip group 105 may be surrounded by same or different other first chip groups 105 and/or surrounded by same or different capacitors, resistors, and inductors from first passive device group 104. Similarly, a first passive device group 104 may be surrounded by same or different other first passive device groups 104 and/or surrounded by one or more same or different first chip group 105.

Figure 4:
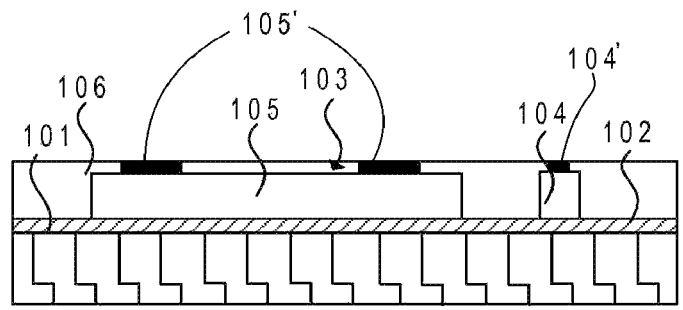

Returning to FIG. 11, after the first mounting layer 103 is attached on the substrate 101 (S1021), a first sealant layer is formed on the substrate at the same side attached with the first mounting layer 103 (S1022). FIG. 4 shows a corresponding structure.

As shown in FIG. 4, a first sealant layer 106 is formed on top of the substrate 101 covering the first mounting layer 103 while exposing the connection parts of the first mounting layer 103. That is, the first sealant layer 106 may cover and isolate or insulate components in the first mounting layer 103 with the connection parts of the components exposed. The exposed connection parts may include, for example, the bonding pad(s) of the first chip group 105 and bonding pad(s) of the first passive device group 104. In subsequent manufacturing processes, the sealant layer 106 not only can protect other surfaces of the first chip group 105 and the first passive device group 104 except the exposed connection surfaces, but also can serve as a carrier for the subsequent processes. Further, the first sealant layer 106 may also provide insulation and isolation for the components in the first mounting layer 103 (e.g., the first chip group 105, the first passive device group 104).

The first sealant layer 106 may include any appropriate material and may have a thickness approximately same as the thickness of the first mounting layer 103. In one embodiment, the first sealant layer 106 is epoxy. Epoxy may be a desired material for forming the first sealant layer 106 because of its high sealing performance and easy molding. Further, the first sealant layer 106 may be formed using various methods, such as turn injection, compression, or printing, etc.

Figure 5:
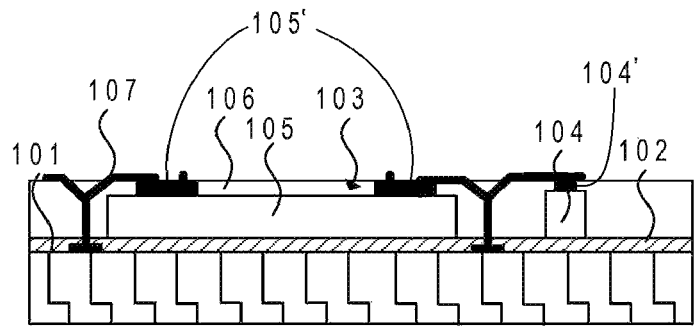

Returning to FIG. 11, after forming the first sealant layer 106, a first wiring layer is formed on the first sealant layer 106 (S1023). FIG. 5 shows a corresponding structure.

As shown in FIG. 5, first wiring layer 107 is formed on top of the first sealant layer 106. More specifically, the first wiring layer 107 may include a first vertical wiring and a first horizontal wiring. The first vertical wiring may be used to achieve electrical connections between the first chip group 105 and first passive device group 104 (together referred as the first package group) and the substrate 101 and between the first package group and other package groups. The first horizontal wiring may be used to achieve electrical connections among components in the first package group.

To form the first wiring layer 107, first vias may be formed in the first sealant layer 106 and conductive material is then filled in the first vias to form the first vertical wiring. Further, first horizontal wiring connecting the first vertical wiring is formed on the first sealant layer 106.

More particularly, the first vias may be formed by drilling. The first vias extend through the first sealant layer 106 and expose the bonding pads on the substrate 101 to form interconnect channels with the substrate 101. Further, the first vias are filled with conductive material to form the first vertical wiring. Conductive material may also be deposited on top of the first sealant layer 106 to form the first horizontal wiring connecting the first vertical wiring. The first horizontal wiring may be used to connect the first chip group 105 and the first passive device group 104, and may be formed by any appropriate conductive material, such as copper, etc.

Because the sealant layer 106 has desired insulating performance, vertical wiring can be selectively formed in the sealant layer to achieve interconnect between mounting layers and between a mounting layer and the substrate. Interference among components in various mounting layers can be reduced or avoided. The first mounting layer 103, the first sealant layer 106, and the first wiring layer 107 may be referred as the first package layer.

Figure 6:
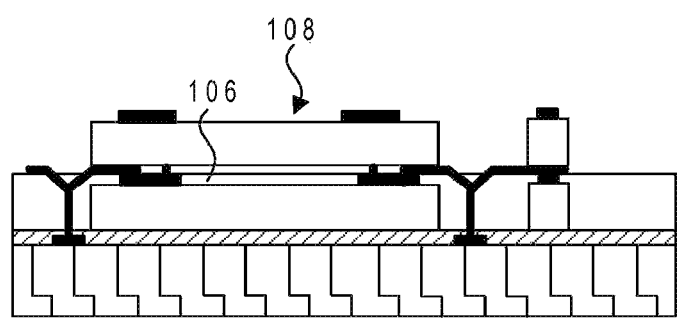

Returning to FIG. 11, after the first package layer is completed, a second mounting layer is stacked or attached on the first wiring layer 107 (S1024). FIG. 6 shows a corresponding structure.

As shown in FIG. 6, a second mounting layer 108 is stacked on the first sealant layer 106 over the first wiring layer 107. The term "stacking", as used herein, refers to placing or attaching the second mounting layer 108 on a predetermined location on the first sealant layer 106 over the first wiring layer 107. Further, the second mounting layer 108 is stacked with functional surface facing up. Similar to the first mounting layer 103, the second mounting layer 108 may include a second chip group and a second passive device group.

Figure 7:
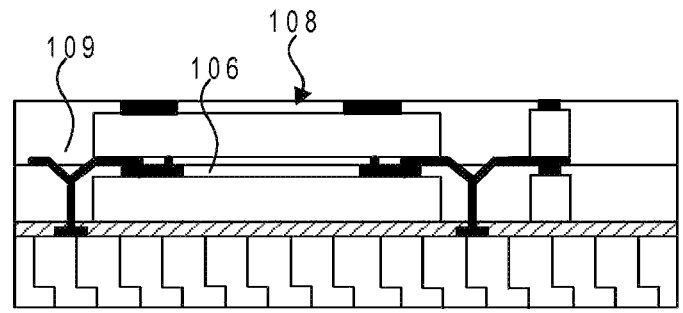

Returning to FIG. 11, after the second mounting layer 108 is formed, a second sealant layer is formed on the first sealant layer 106 and covering the second mounting layer 108 (S1025). FIG. 7 shows a corresponding structure.

As shown in FIG. 7, second sealant layer 109 is formed on top of the first sealant layer 106 and covering the second mounting layer 108. The second sealant layer 109 is also formed in such a way to expose bonding pads of the second chip group and bonding pads of the second passive device group in the second mounting layer 108 (i.e., the second package group). The second sealant layer 109 may include material similar to the first sealant layer 106, such as epoxy.

Figure 8:
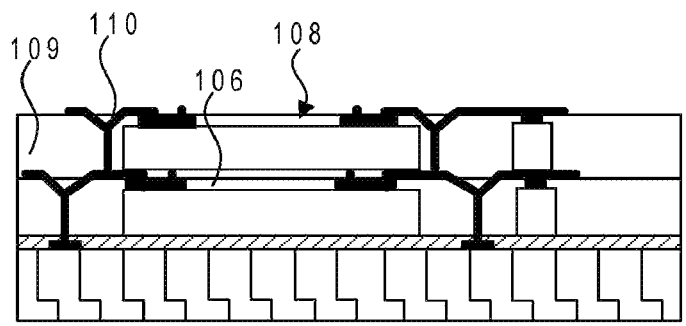

Further, returning to FIG. 11, a second wiring layer is formed on the second sealant layer 109 (S1026). FIG. 8 shows a corresponding structure.

As shown in FIG. 8, a second wiring layer 110 is formed on the second sealant layer 109. More specifically, the second wiring layer 110 includes a second vertical wiring and a second horizontal wiring. The second vertical wiring may be used to achieve electrical connection between the second package group and other package group(s) and between the second packaging group and the substrate 101 through first vias in the first sealant layer 106. The second horizontal wiring may be used to achieve electrical connection among components of the second package group.

To form the second wiring layer 110, second vias may be formed in the second sealant layer 109 and conductive material is then filled in the second vias to form the second vertical wiring. Further, second horizontal wiring connecting the second vertical wiring is formed on the second sealant layer 109. Further, the second wiring layer 110 may be formed similar to the first wiring layer 107 and the detailed descriptions are thus omitted. The second mounting layer 108, the second sealant layer 109, and the second wiring layer 110 may be referred as the second package layer.

Figure 9:
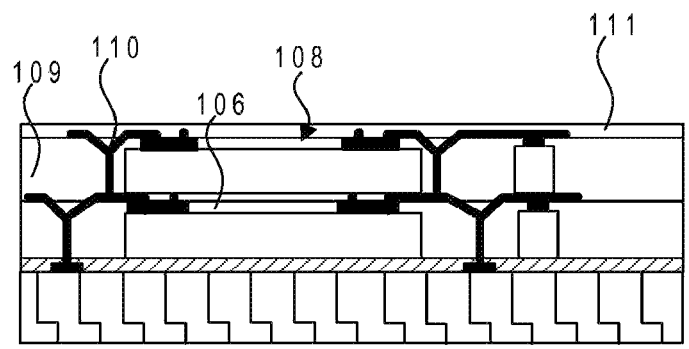

Returning to FIG. 1, after the first package layer and the second package layer is completed, a top sealant layer is formed on a top-level package layer (S103). FIG. 9 shows a corresponding structure.

As shown in FIG. 9, a top sealant layer 111 is formed on top of the second wiring layer 110. The top sealant layer 111 may be used to protect the second wiring layer 110 from being damaged. The material and method for forming the top sealant layer 111 may be similar to the first sealant layer 106 and/or the second sealant layer 109.

Figure 10:
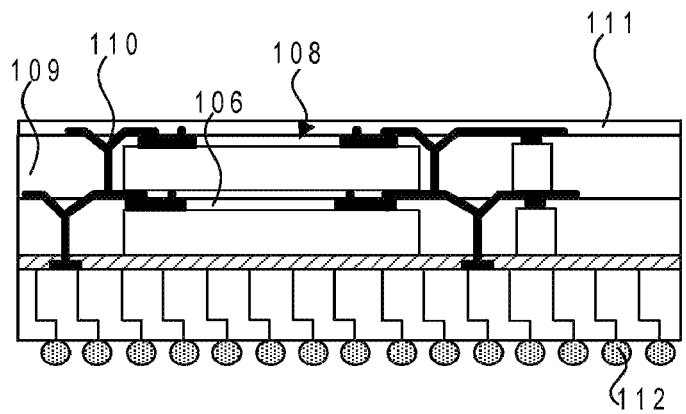

Further, returning to FIG. 1, solder balls or bumps are planted on the bottom surface of the substrate 101 (S104). FIG. 10 shows a corresponding structure.

As shown in FIG. 10, solder balls 112 are planted on the bottom surface of the substrate 101 to form the connection balls. More specifically, solder balls are planted or deposited at locations corresponding to wiring pads of the substrate 101 such that internal wiring can be outputted through the connection balls. The solder balls may include any appropriate material, such as metal tin or other types of metals.

Thus, at this point, a system-level packaging structure is formed, including the plurality of package layers with the interconnect between the plurality of package layers achieved through the wiring layers. Although two package layers (i.e., the first package layer and the second package layer) are used for illustrative purposes, any number of package layers may be used.

Figure 12:
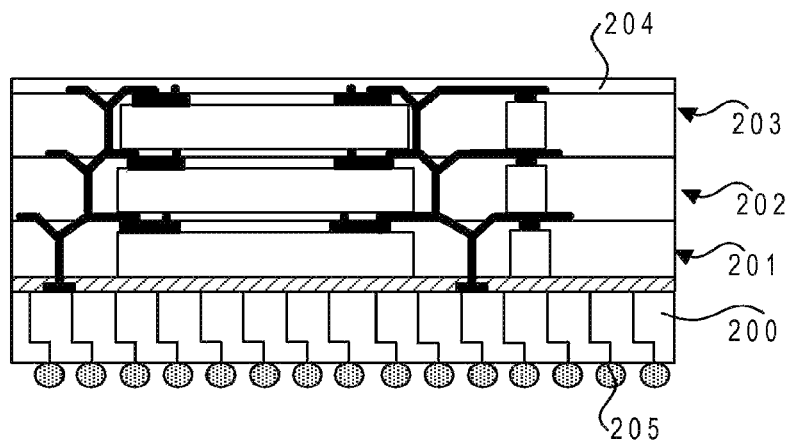
FIG. 12 illustrates another exemplary system-level packaging structure consistent with the disclosed embodiments.

For example, FIG. 12 shows a system-level packaging structure with three package layers. As shown in FIG. 12, the system-level packaging structure includes: packaging substrate 200, a first package layer 201, a second package layer 202, and a third package layer 203 formed on the packaging substrate 200 in sequence; a top sealant layer 204 formed on the third package layer, and connection balls (solder balls) 205 arranged on the bottom surface of the packaging substrate 200. The third package layer 203 may be similar to the first package layer and the second package layer in FIG. 1 and may include a third mounting layer, a third sealant layer, and a third wiring layer formed on the second package layer sequentially.

Figure 13:
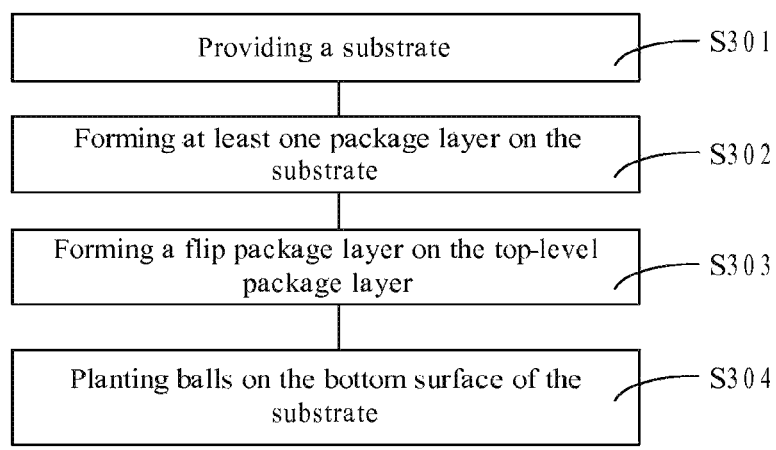
FIG. 13 illustrates another exemplary system-level packaging process consistent with the disclosed embodiments.

Alternatively and/or optionally, a top-level package layer may be configured as a flip package layer in the system-level packaging structure. FIG. 13 illustrates another exemplary system-level packaging process consistent with the disclosed embodiments. FIGS. 14-21 illustrate corresponding structures during the packaging process.

Figure 14:
FIGS. 14-21 illustrate exemplary packaging structures corresponding to various steps in the system-level packaging process consistent with the disclosed embodiments.
Figure 15:
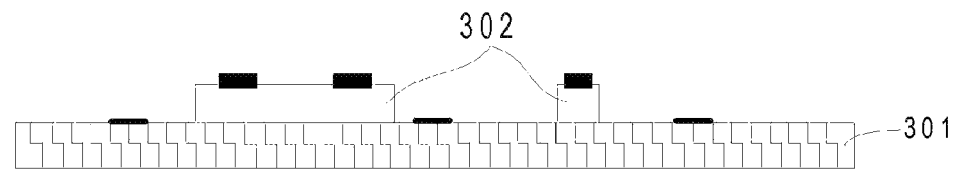
Figure 16:
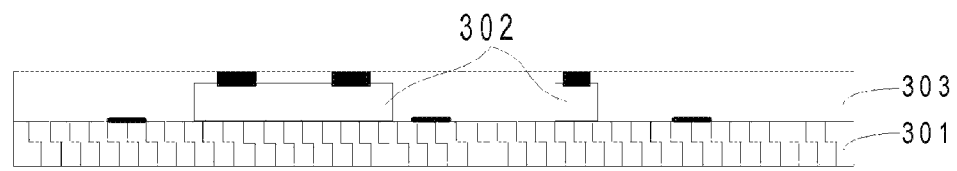

As shown in FIG. 13, at the beginning of the process, similar to FIG. 1, a packaging substrate 301 is provided (S301). Further, at least one wiring and package layer is formed on the substrate 301 (S302). For example, a first straight mounting layer 302 is attached to the substrate 301; and a first sealant layer 303 is formed on top of the substrate 301 covering the first straight mounting layer 302 while exposing the connection parts (e.g., bonding pads) of the first straight mounting layer 302. FIGS. 14-16 illustrate the corresponding structures during the packaging process.

Figure 17:
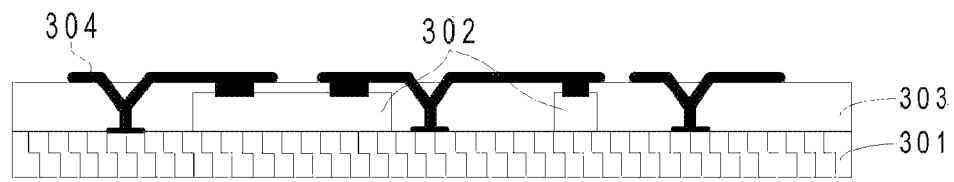
Figure 18:
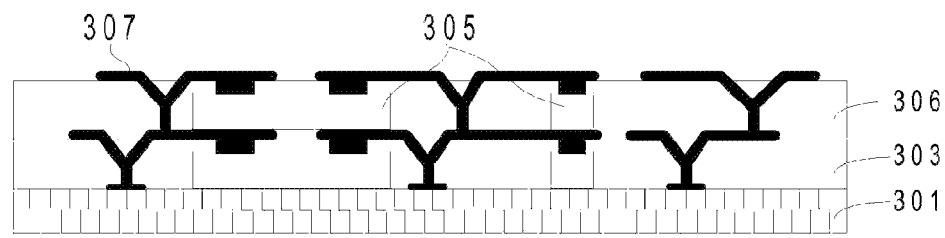

Further, a first wiring layer 304 is formed on top of the first sealant layer 303; and first vias may be formed in the first sealant layer 303 and conductive material is then filled in the first vias to form the first vertical wiring. First horizontal wiring connecting the first vertical wiring is formed on the first sealant layer 303. Further, a second straight mounting layer 305 may be stacked or attached on the first wiring layer 304; a second sealant layer 306 is formed on top of the first sealant layer 303 and covering the second straight mounting layer 305; and a second wiring layer 307 is formed on the second sealant layer 306. FIGS. 17-18 illustrate the corresponding structures during the packaging process.

More specifically, the second wiring layer 307 includes a second vertical wiring and a second horizontal wiring.

Second vias may be formed in the second sealant layer 306 and conductive material is then filled in the second vias to form the second vertical wiring, which may be used to achieve electrical connection between the second straight mounting layer 305 and other mounting layers and between the second straight mounting layer 305 and the substrate 301 through first vias in the first sealant layer 303. The second horizontal wiring may be used to achieve electrical connection among components of the second straight mounting layer 305.

Figure 19:
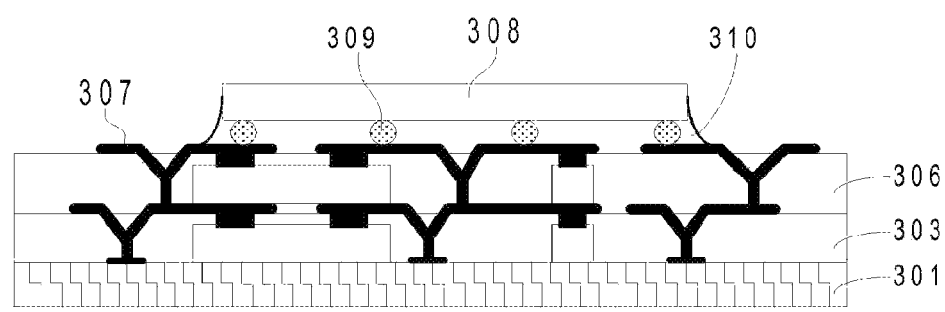

After the first package layer and the second package layer are completed, a flip chip package layer is formed on a top-level package layer (i.e., the top-level package layer) (S303), as shown in FIG. 13. To form the flip chip package layer, a flip mounting layer 308 may be formed on the top-level package layer, i.e., the second package layer, as shown in FIG. 19. More specifically, the flip mounting layer 308 may be formed over the second sealant layer 306 and the second wiring layer 307.

Figure 20:
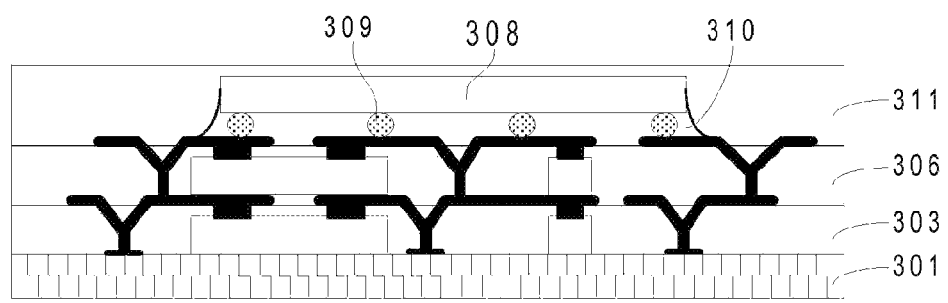
Figure 21:
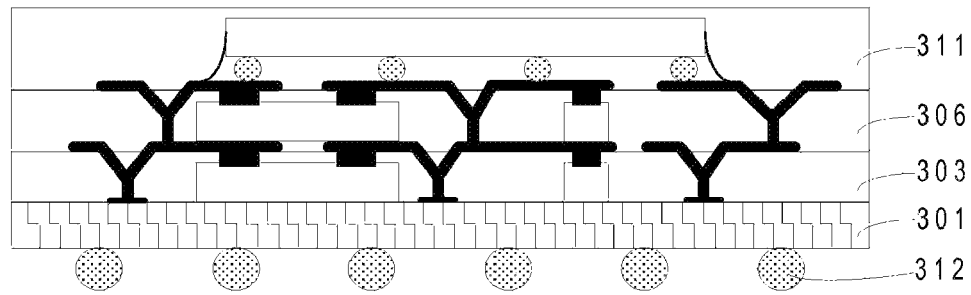

More particularly, the flip mounting layer 308 may include one or more chips and each chip may have solder bumps 309. The chip with solder bumps is flipped on the second horizontal wiring of the second wiring layer 307 to form the flip mounting layer 308. The flip chip is electrically connected with the second wiring layer 307 through the solder bumps 309, and the system interconnect between the flip mounting layer 308 and other wiring and package layers is also achieved. FIGS. 19-20 illustrate corresponding structures during the packaging process.

In addition, passive devices can also be arranged on the sides of the flip chip. The mounting direction of the passive devices may be the same as the mounting direction of the flip chip to simplify the manufacturing process. For example, the functional bonding pads of the passive devices can be mounted on predetermined locations on the wiring layer to realize the electrical interconnection.

Further, the space between the flip mounting layer 308 and the second sealant layer 306 and wiring layer 307 is filled with filling material 310 to form an underfill, as shown in FIG. 20. In certain embodiments, the filling material 310 forming the underfill is a polymer epoxy resin. The polymer epoxy resin may have a desired fluidity and can be used to fully fill the gap between the flip chip and the second sealant layer 306 and to avoid reliability issues such as internal voids in the subsequently formed sealant layer.

Further, as shown in FIG. 20, a third sealant layer 311 is formed on top of the second sealant layer 306 entirely covering the flip mounting layer 308. FIG. 20 shows a corresponding structure. That is, the flip mounting layer 308 is encapsulated by the sealant from the third sealant layer 311. The material and method for forming the third sealant layer 311 may be similar to the first sealant layer 303 and/or the second sealant layer 306. The flip mounting layer 308 and the third sealant layer 311 may be referred as the flip package layer.

After the flip package layer is formed (S303), as shown in FIG. 13, solder balls or bumps 312 are planted on the bottom surface of the substrate 301 (304).

Figure 22:
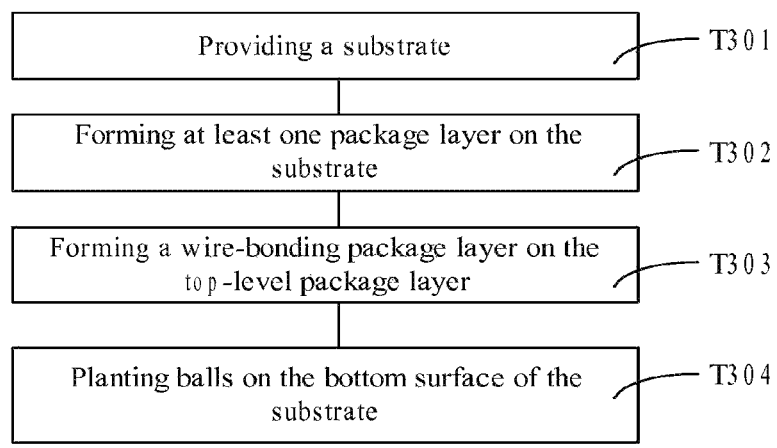
FIG. 22 illustrates another exemplary system-level packaging process consistent with the disclosed embodiments.

Alternatively and/or optionally, instead of the flip package layer, a wire-bonding package layer may be created in the system-level packaging structure. FIG. 22 illustrates another exemplary system-level packaging process consistent with the disclosed embodiments.

As shown in FIG. 22, at the beginning of the process, similar to S301 in FIG. 14, a packaging substrate 301 is provided (T301). Further, also similar to S302 in FIG. 14, at least one wiring and package layer is formed on the substrate 301 (T302). Because T301 and T302 are similar to or the same as S301 and S302, respectively, detailed descriptions of T301 and T302 are omitted.

Figure 23:
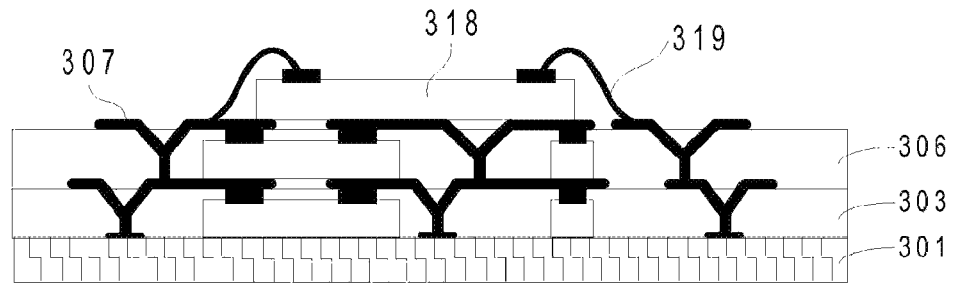
FIGS. 23-25 illustrate other exemplary packaging structures corresponding to certain steps in the system-level packaging process consistent with the disclosed embodiments.

Further, a wire-bonding package layer is formed on the top-level wiring and package layer (T303). FIG. 23 shows a corresponding structure. As shown in FIG. 23, to form the wire-bonding package layer, a third mounting layer 318 is stacked on the second sealant layer 306. The third mounting layer 318 may be similar to the first straight mounting layer 302 and/or the second straight mounting layer 305 and may include one or more same or different chips and one or more same or different passive devices. The chips and/or the passive devices are mounted with the functional surface facing up.

The chip in the third mounting layer 318 or the pads of the chip and the pads of the passive devices in the third mounting layer 318 are electrically connected with the second wiring layer 307 using metal wires 319 using a wire bonding process.

Figure 24:
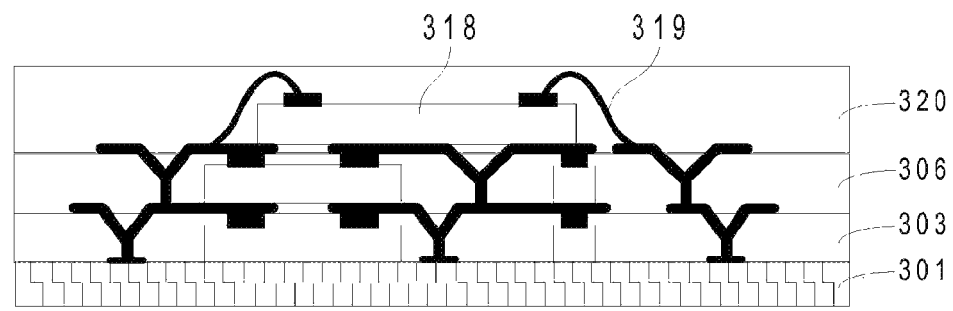

Further, as shown in FIG. 24, a third sealant layer 320 is formed on the second sealant layer 306 and covering the third mounting layer 318. The third mounting layer 318 and the metal wires 319 are fully encapsulated by the sealing material from the third sealant layer 320. The third sealant layer 320 may include sealing materials similar to those from the first sealant layer 303 and/or the second sealant layer 306, such as epoxy resin. The third mounting layer 318, metal wires 319, and the third sealant layer 320 may be referred as the wire-bonding package layer.

Figure 25:
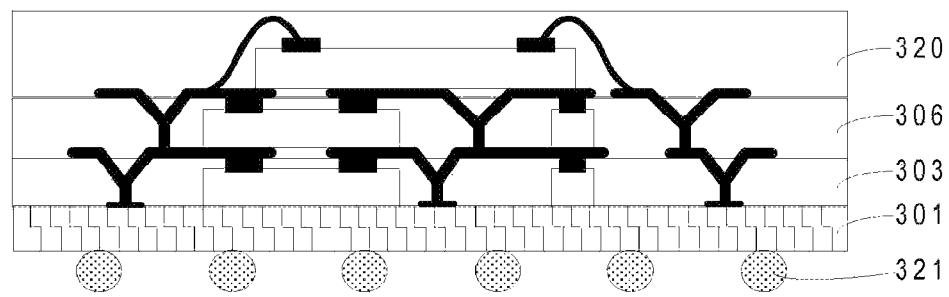

After the wire-bonding package layer is formed (T303), as shown in FIG. 22, solder balls or bumps are planted on the bottom surface (i.e., the second functional surface) of the substrate 301 (T304). FIG. 25 shows a corresponding structure.

As shown in FIG. 25, solder balls 321 are planted on the bottom surface of the substrate 301 to form the connection balls. More specifically, solder balls are planted or deposited at locations corresponding to wiring pads of the substrate 301 such that internal wiring can be outputted. The solder balls may include any appropriate material, such as metal tin, tin alloy, or other types of metals.

Thus, at this point, a system-level packaging structure is formed, including the plurality of package layers with the interconnect between the plurality of package layers achieved through the wiring layers, solder bumps, and wire-bonding. Although two package layers (i.e., the first package layer and the second package layer) are used for illustrative purposes, any number of package layers may be used.

The disclosed systems and methods may provide many advantageous IC packaging applications. The internal wiring of the substrate further provides system integration and the system functions are outputted through planted connection balls. In addition, because the sealant layers have similar thickness to the mounting layers and have desired insulation and isolation performance, the integration degree of the system-level packaging structure may be substantially increased. Other applications and advantages are obvious to those skilled in the art.

What is claimed is:
1. A system-level packaging method, comprising:
providing a packaging substrate having a first functional surface and a second surface with wiring arrangement within the packaging substrate and between the first functional surface and the second surface;

forming at least two package layers on the first functional surface of the packaging substrate, wherein the at least two package layers include a first package layer formed by:
  attaching at least one first chip group and at least one first passive device group spaced apart on the packaging substrate by a glue layer, the at least one first chip group and the at least one first passive device group comprise connection parts having a first thickness,
  after the at least one chip group and the at least one passive device group is attached on the packaging substrate, forming a first sealant layer on the packaging substrate covering the at least one first chip group and the at least one first passive device group, and filling spaces between the at least one first chip group and the at least one first passive device group, the first sealant layer has a second thickness directly above the at least one first chip group and the at least one first passive device group, wherein the first thickness and the second thickness are equal, wherein the connection parts of the at least one first chip group and the at least one first passive device group are exposed from the first sealant layer, the at least one first chip group and the at least one first passive device group are insulated from each other, and a top surface of the first sealant layer is coplanar with the top surface of the connection parts of the at least one first chip group and the at least one first passive device group, and
  after forming the first sealant layer on the packaging substrate, forming vias through the first sealant layer and extending to the packaging substrate, and forming a first wiring layer passing through the vias in the first sealant layer and electrically connects to the packaging substrate, the first wiring layer providing electrical connection between the at least one first chip group and the at least one first passive device group in the first mounting layer;
stacking at least one second chip group and at least one second passive device group directly on the first wiring layer;
forming a top sealant layer; and
planting connection balls on the second functional surface of the packaging substrate.

2. The method according to claim 1, wherein forming the at least two package layers further includes forming a second package layer on the first package layer by:
  forming a second sealant layer on the first sealant layer and covering the at least one second chip group and second passive device group; and
  forming a second wiring layer on the second sealant layer, the second wiring layer providing electrical connection between the at least one second chip group and the at least one second passive device group.

3. The method according to claim 1, wherein attaching the at least one first chip group and the at least one first passive device group further includes:
  forming the glue layer on the first functional surface of the packaging substrate; and
  attaching the at least one first chip group and the at least one first passive device group on the glue layer.

4. The method according to claim 1, wherein forming the first wiring layer on the first sealant layer further includes:
  forming first vias in the first sealant layer;
  filling conductive material in the first vias to form a first vertical wiring, which is used to realize electrical connection between a first package layer and a second package layer and between the first package layer and the packaging substrate;
  forming first horizontal wiring on the first sealant layer connecting the first vertical wiring, the first horizontal wiring being used to realize electrical connection among components in the first package layer.

5. The method according to claim 1, wherein:
each first chip group has one or more chips; and
each first passive device group has one or more of capacitors, resistors, and inductors.

6. The method according to claim 1, wherein:
the first sealant layer or the top sealant layer is made of epoxy to provide insulation and isolation for the at least one first chip group and the at least one first passive device group and formed using a method of turn injection, compression, or printing.

7. The method according to claim 1, before forming the top sealant layer, further including:
  forming a flip package layer on a top-level package layer of the at least two package layers, wherein the at least two package layers are formed by consecutively stacking one on another on the surface of the packaging substrate.

8. The method according to claim 7, wherein forming the flip package layer further includes:
  flipping a chip with solder bumps onto a horizontal wiring of a top-level package layer to form a flip mounting layer, the flip mounting layer being electrically interconnected with the package layer through the solder bumps; and
  filling the space between the flip mounting layer and the top-level package layer with filling material to form an underfill, wherein the top sealant layer is formed on top of the top-level package layer and covering the flip mounting layer such that the flip mounting layer is encapsulated by the top sealant layer.

9. The method according to claim 1, before forming the top sealant layer, further including:
  forming a wire-bonding package layer on a top-level package layer of the at least two package layers.

10. The method according to claim 9, wherein forming the wire-bonding package layer further includes:
  forming a mounting layer on the top-level package layer;
  electrically connecting the mounting layer with a wiring layer of the top-level package layer using metal wires; and
  forming a sealant layer on the top-level package layer and covering the mounting layer such that the mounting layer and the metal wires are encapsulated by the top sealant layer.

11. The method according to claim 2, further comprising forming an additional package layer on the second package layer by:
  forming an additional chip group on the second wiring layer;
  forming an additional sealant layer after the formation of the additional mounting layer; and
  forming an additional wiring layer by first forming vias through the additional sealant layer extending to the second vias, and forming an additional wiring layer including a vertical wiring between the additional chip group and the substrate and formed in the additional sealant layer to electrically connect the additional chip group and the substrate, and a horizontal wiring between the additional chip group and formed on the additional sealant layer to electrically connect the additional chip group.

12. The method according to claim 2, wherein the second sealant layer fills spaces between the at least one second chip group and the at least one second passive device group, wherein connection parts of the at least one second chip group and the at least one second passive device group are exposed from the second sealant layer, the at least one second chip group and the at least one second passive device group are insulated from each other, and a top surface of the second sealant layer is coplanar with the top surface of the connection parts of the at least one second chip group and the at least one second passive device group.

* * * * *